(12) United States Patent
Kadota

(10) Patent No.: US 9,413,331 B2
(45) Date of Patent: Aug. 9, 2016

(54) PIEZOELECTRIC BULK-WAVE RESONATOR

(71) Applicant: MURATA MANUFACTURING CO., LTD., Nagaokakyo-shi, Kyoto-fu (JP)

(72) Inventor: Michio Kadota, Nagaokakyo (JP)

(73) Assignee: MURATA MANUFACTURING CO., LTD., Nagaokakyo-Shi, Kyoto-Fu (JP)

( * ) Notice: Subject to any disclaimer, the term of this patent is extended or adjusted under 35 U.S.C. 154(b) by 202 days.

(21) Appl. No.: 14/278,451

(22) Filed: May 15, 2014

(65) Prior Publication Data

US 2014/0339960 A1 Nov. 20, 2014

(30) Foreign Application Priority Data

May 15, 2013 (JP) .................................. 2013-102654

(51) Int. Cl.
- *H01H 41/08* (2006.01)
- *H03H 9/17* (2006.01)
- *H03H 9/02* (2006.01)

(52) U.S. Cl.
CPC ........... *H03H 9/177* (2013.01); *H03H 9/02015* (2013.01)

(58) Field of Classification Search
CPC .......................... H03H 9/02015; H03H 9/177
USPC .......... 310/357, 320, 358, 321, 366, 365, 313
See application file for complete search history.

(56) References Cited

U.S. PATENT DOCUMENTS

| 6,025,636 A * | 2/2000 | Nakahata | H03H 9/02582 310/313 A |
| 8,143,762 B2 * | 3/2012 | Nakahashi | H03H 9/02984 310/313 B |
| 2004/0164645 A1 * | 8/2004 | Oshio | H03H 3/08 310/313 B |
| 2010/0187947 A1 * | 7/2010 | Mimura | H03H 9/0222 310/313 A |

FOREIGN PATENT DOCUMENTS

| FR | WO2009156658 | * 12/2009 | ............... H03H 9/02 |
| FR | WO2009156658 A1 | * 12/2009 | ............... H03H 9/02 |
| JP | 60-113511 | 6/1985 | |
| JP | 4-222108 | 8/1992 | |

* cited by examiner

*Primary Examiner* — Thomas Dougherty
*Assistant Examiner* — Karen B Addison
(74) *Attorney, Agent, or Firm* — Arent Fox LLP

(57) ABSTRACT

A piezoelectric bulk-wave resonator has a single-crystal $LiNbO_3$ substrate whose Euler Angles are in the ranges of about (78° to 106°, 78° to 104°, 18° to 53°), a first driver electrode on a first main surface of the single-crystal $LiNbO_3$ substrate, and a second driver electrode on a second main surface. The first driver electrode and the second driver electrode overlap with the single-crystal $LiNbO_3$ substrate therebetween. The piezoelectric bulk-wave resonator uses the thickness-shear mode.

5 Claims, 16 Drawing Sheets ated Y cut is used. The Euler Angle representation of this about 165°±5° rotated Y cut is about (0°, 75°±5°, 90°).

PIEZOELECTRIC BULK-WAVE RESONATOR

BACKGROUND OF THE INVENTION

1. Field of the Invention

The present invention relates to a piezoelectric bulk-wave resonator that uses the thickness-shear mode and, more specifically, to a piezoelectric bulk-wave resonator in which a single-crystal $LiNbO_3$ substrate is used.

2. Description of the Related Art

Various thickness-shear mode piezoelectric resonators have hitherto been proposed for bulk waves generated by a substantially strip-shaped piezoelectric body. For example, Japanese Unexamined Patent Application Publication No. 4-222108 discloses a thickness-shear vibrator in which a $LiNbO_3$ single crystal is used.

Japanese Unexamined Patent Application Publication No. 60-113511 discloses a thickness-shear resonator in which a $LiNbO_3$ single crystal taken from an about 165°±5° rotated Y cut is used. The Euler Angle representation of this about 165°±5° rotated Y cut is about (0°, 75°±5°, 90°).

As described in these publications, various thickness-shear resonators in which a single-crystal $LiNbO_3$ substrate is used have hitherto been proposed. However, the frequency difference between the resonant frequency and the anti-resonant frequency of such known resonators, namely the band width, is not very broad, making it difficult to prepare wide-band filters.

SUMMARY OF THE INVENTION

Accordingly, it is an object of the present invention to provide a piezoelectric bulk-wave resonator that uses the thickness-shear mode and can have an increased band width.

A piezoelectric bulk-wave resonator according to a preferred embodiment of the present invention uses the thickness-shear mode. A piezoelectric bulk-wave resonator according to a preferred embodiment of the present invention has a single-crystal $LiNbO_3$ substrate and first and second driver electrodes.

The single-crystal $LiNbO_3$ substrate has a first main surface and a second main surface opposite the first main surface. The first driver electrode extends over a certain area on the first main surface, and the second driver electrode extends on the second main surface, facing the first driver electrode across the single-crystal $LiNbO_3$ substrate.

A piezoelectric bulk-wave resonator according to a preferred embodiment of the present invention has a single-crystal $LiNbO_3$ substrate whose Euler Angles are in the ranges of about (78° to 106°, 78° to 104°, 18° to 53°).

More preferably, the Euler Angles are in the ranges of about (79° to 103°, 80° to 102°, 22° to 50°).

Preferably, the single-crystal $LiNbO_3$ substrate has a substantially rectangular planar shape.

Piezoelectric bulk-wave resonators according to preferred embodiments of the present invention, in which the Euler Angles of a single-crystal $LiNbO_3$ substrate are in the particular ranges specified above, allow wide-band resonators that have a band width of about 18% or more to be provided.

Other features, elements, characteristics and advantages of the present invention will become more apparent from the following detailed description of preferred embodiments of the present invention with reference to the attached drawings.

DETAILED DESCRIPTION OF THE PREFERRED EMBODIMENTS

The following clarifies a certain aspect of the present invention by describing some specific embodiments of the present invention with reference to the drawings.

Figure 1A:
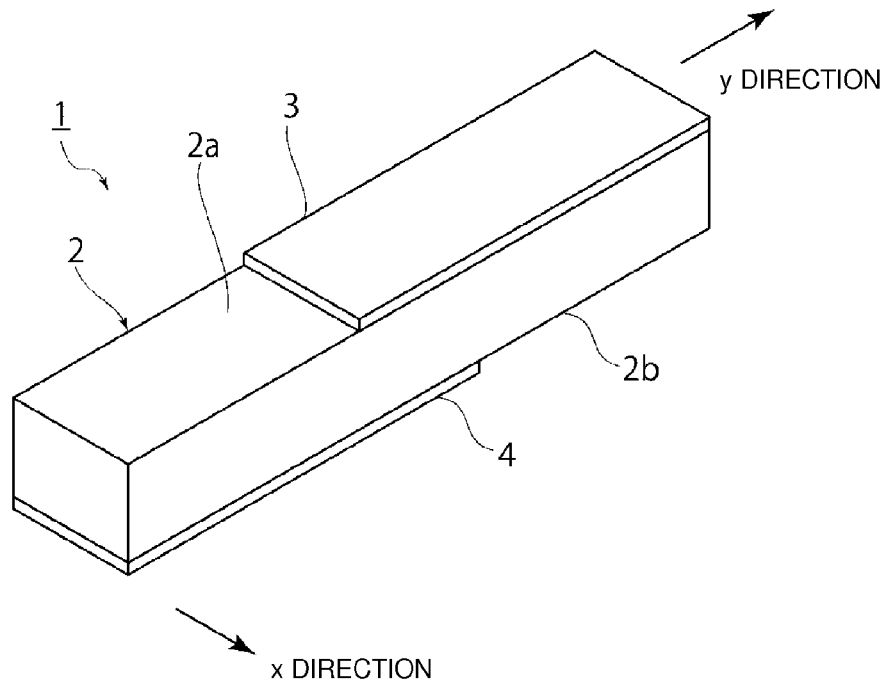
FIG. 1A and FIG. 1B are a perspective view and a side view, respectively, of the appearance of a piezoelectric bulk-wave resonator according to an embodiment of the present invention.
Figure 1B:
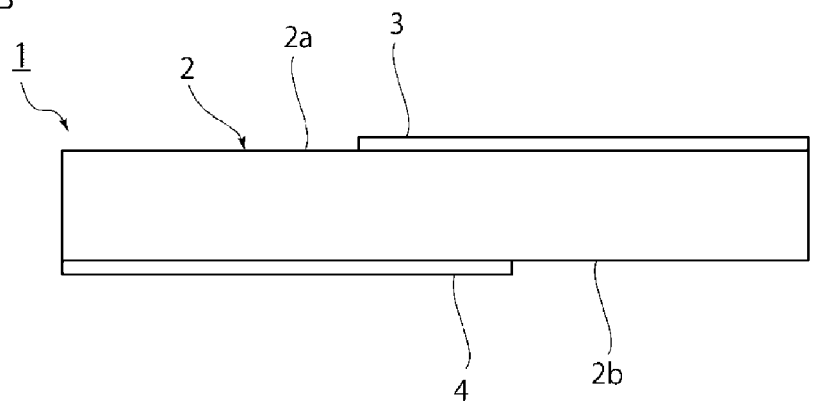

FIG. 1A and FIG. 1B are a perspective view and a side view, respectively, of a piezoelectric bulk-wave resonator according to an embodiment of the present invention.

A piezoelectric bulk-wave resonator 1 has a single-crystal LiNbO₃ substrate 2. The single-crystal LiNbO₃ substrate 2 is shaped like a strip that has a longitudinal direction. In other words, the single-crystal LiNbO₃ substrate 2 has a substantially rectangular planar shape. The single-crystal LiNbO₃ substrate 2 has a first main surface 2a that extends in the longitudinal direction and a second main surface 2b opposite the first main surface 2a.

A first driver electrode 3 extends on the first main surface 2a. A second driver electrode 4 extends on the second main surface 2b. The first driver electrode 3 and the second driver electrode 4 overlap with the single-crystal LiNbO₃ substrate 2 therebetween. The portion where the first driver electrode 3 and the second driver electrode 4 overlap serves as a vibration section that uses the thickness-shear mode.

The first and second driver electrodes 3 and 4 are made of an appropriate metal, such as Al, Cu, Ag, Pt, or Au, or an alloy and may also be multilayer electrodes made of such materials.

Applying an alternating electric field between the first and second driver electrodes 3 and 4 makes the piezoelectric bulk-wave resonator 1 vibrate, generating bulk waves. In this embodiment, the resonance characteristics of bulk waves in the thickness-shear mode are used.

After extensive research on increasing the band width the inventors found that the use of a single-crystal LiNbO₃ substrate with the Euler Angles thereof in particular ranges can increase the band width and completed the present invention. The aspects of the present invention were therefore made on the basis of these findings the inventors obtained.

The piezoelectric bulk-wave resonator 1 has a single-crystal LiNbO₃ substrate 2 whose Euler Angles ($\phi$, $\theta$, $\psi$) are in the ranges of about (78° to 106°, 78° to 104°, 18° to 53°). As a result, piezoelectric bulk-wave resonators 1 according to this embodiment can have the band width thereof increased to as broad as about 18% or more. More preferably, the Euler Angles are in the ranges of about (79° to 103°, 80° to 102°, 22° to 50°). In this case the band width can be further increased.

Figure 2:
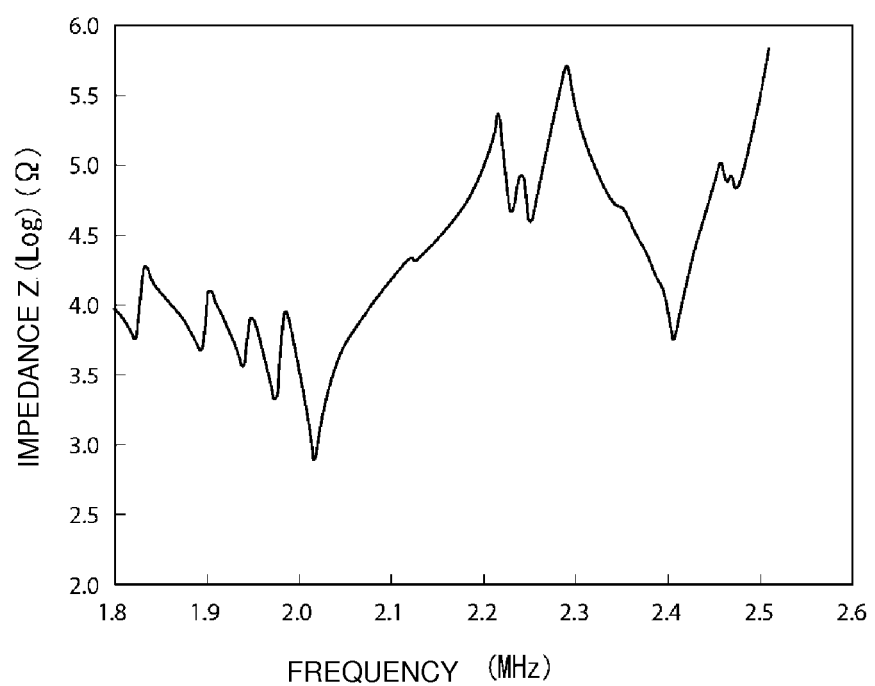
FIG. 2 is a diagram that illustrates the resonance characteristics of a piezoelectric bulk-wave resonator that has a single-crystal $LiNbO_3$ substrate whose Euler Angles are about (90°, 90°, 0°)

FIG. 2 illustrates the resonance characteristics of a piezoelectric bulk-wave resonator 1 with Euler Angles of about (90°, 90°, 0°). The dimensions of the single-crystal LiNbO₃ substrate 2 were about 10 mm×2 mm×1 mm thick. The first and second driver electrodes 3 and 4 were made of Al. The area in which the first and second driver electrodes 3 and 4 faced each other was about 2×1 mm² (the length over which the upper and lower electrodes faced each other was about 1 mm), and the thickness of these electrodes was about 0.01 mm.

FIG. 3 to FIG. 9 individually illustrate the resonance characteristics of piezoelectric bulk-wave resonators that were similar to a piezoelectric bulk-wave resonator that displays the resonance characteristics illustrated in FIG. 2 except that the $\psi$ of the Euler Angles, about (90°, 90°, $\psi$), of the single-crystal LiNbO₃ substrate was about 10°, about 20°, about 30°, about 35°, about 40°, about 50°, and about 60°, respectively.

Table 1 summarizes the relationships between the Euler Angles of the single-crystal LiNbO₃ substrate of the piezoelectric bulk-wave resonators illustrated in FIG. 2 to FIG. 9 and the band width under the resonance characteristics in FIG. 2 to FIG. 9.

TABLE 1

Figure 3:
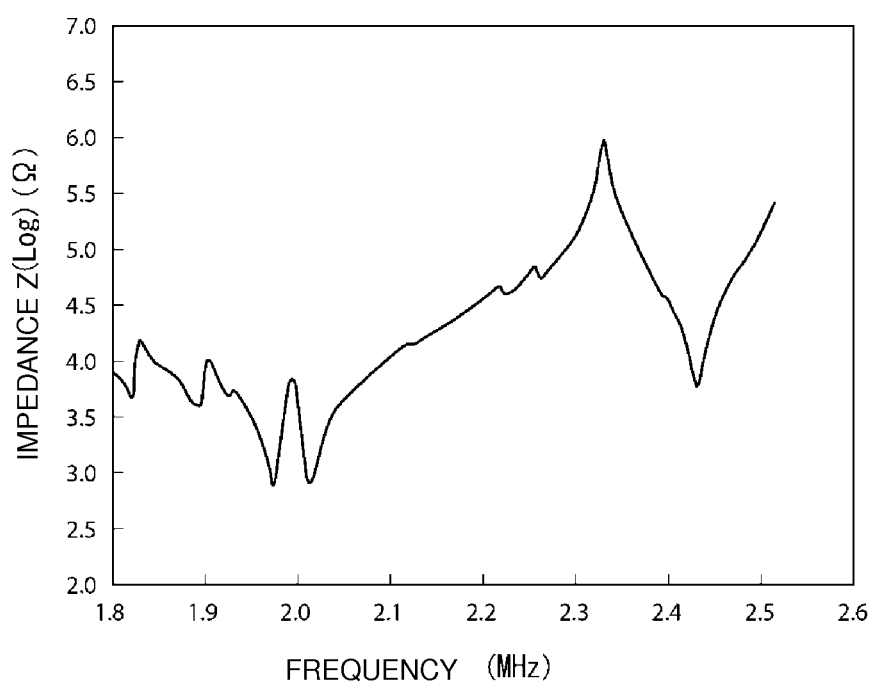
FIG. 3 is a diagram that illustrates the resonance characteristics of a piezoelectric bulk-wave resonator that has a single-crystal $LiNbO_3$ substrate whose Euler Angles are about (90°, 90°, 10°)
Figure 4:
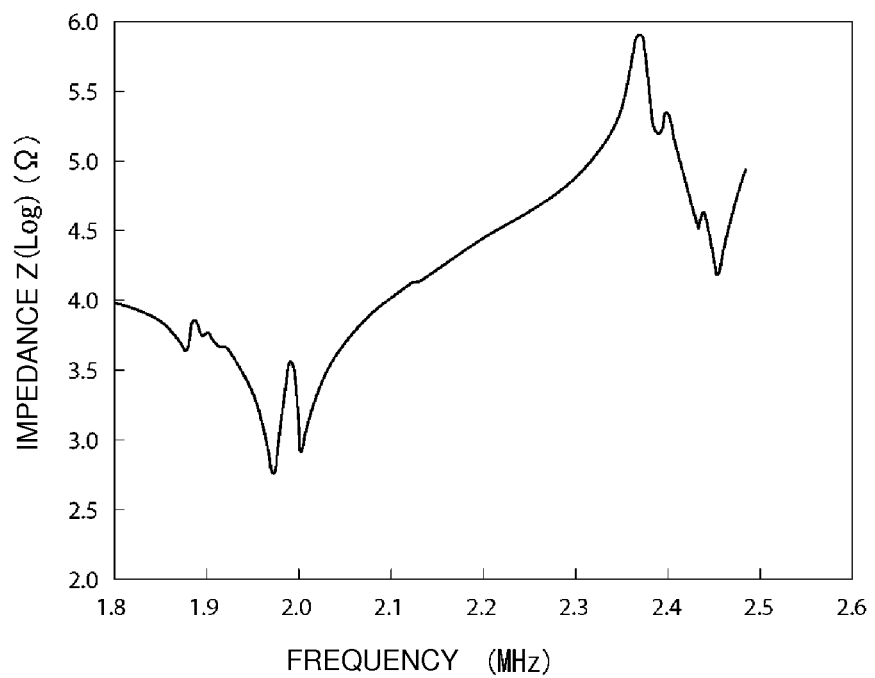
FIG. 4 is a diagram that illustrates the resonance characteristics of a piezoelectric bulk-wave resonator that has a single-crystal $LiNbO_3$ substrate whose Euler Angles are about (90°, 90°, 20°)
Figure 5:
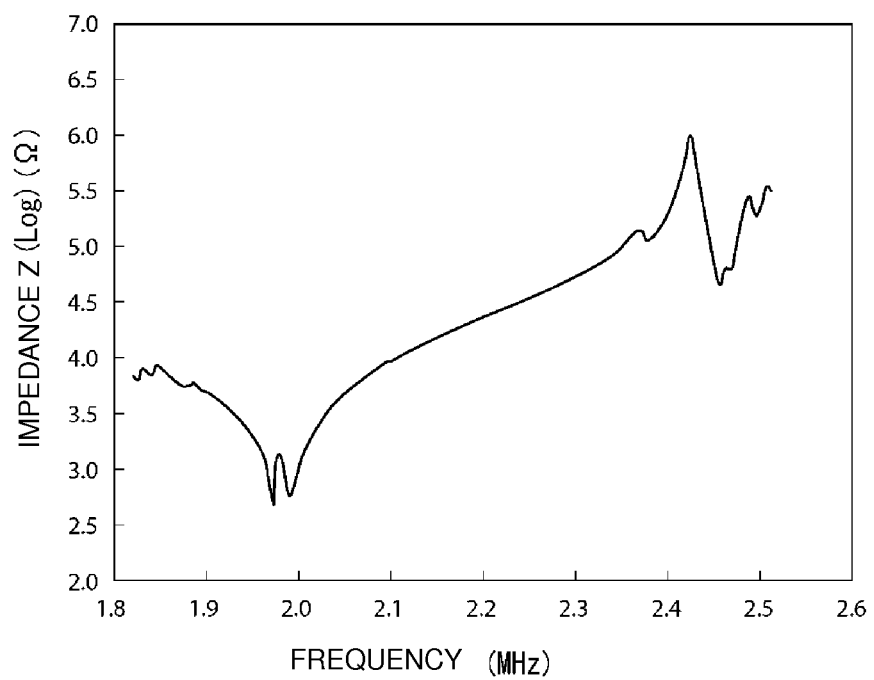
FIG. 5 is a diagram that illustrates the resonance characteristics of a piezoelectric bulk-wave resonator that has a single-crystal $LiNbO_3$ substrate whose Euler Angles are about (90°, 90°, 30°)
Figure 6:
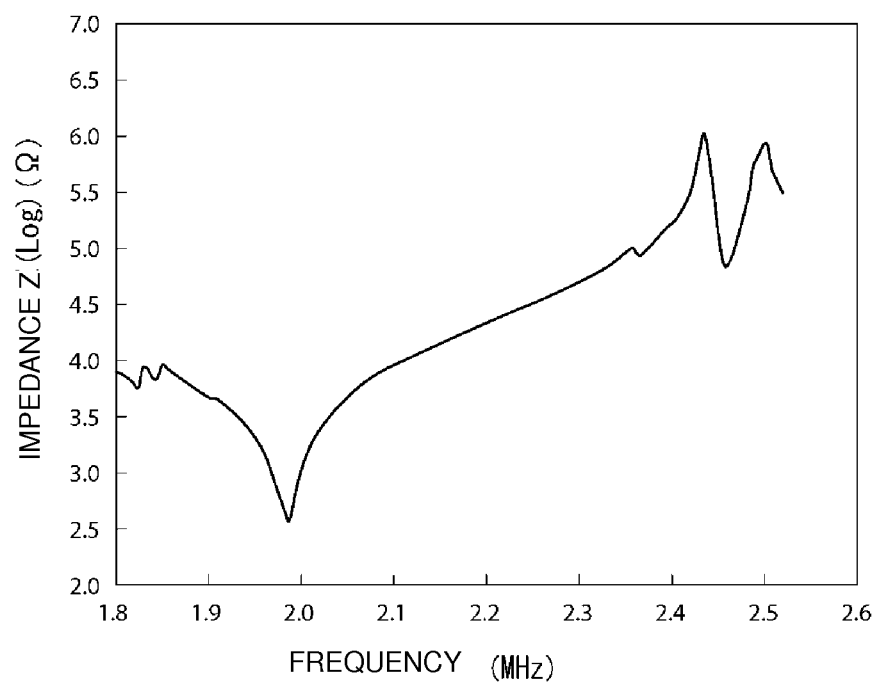
FIG. 6 is a diagram that illustrates the resonance characteristics of a piezoelectric bulk-wave resonator that has a single-crystal $LiNbO_3$ substrate whose Euler Angles are about (90°, 90°, 35°)
Figure 7:
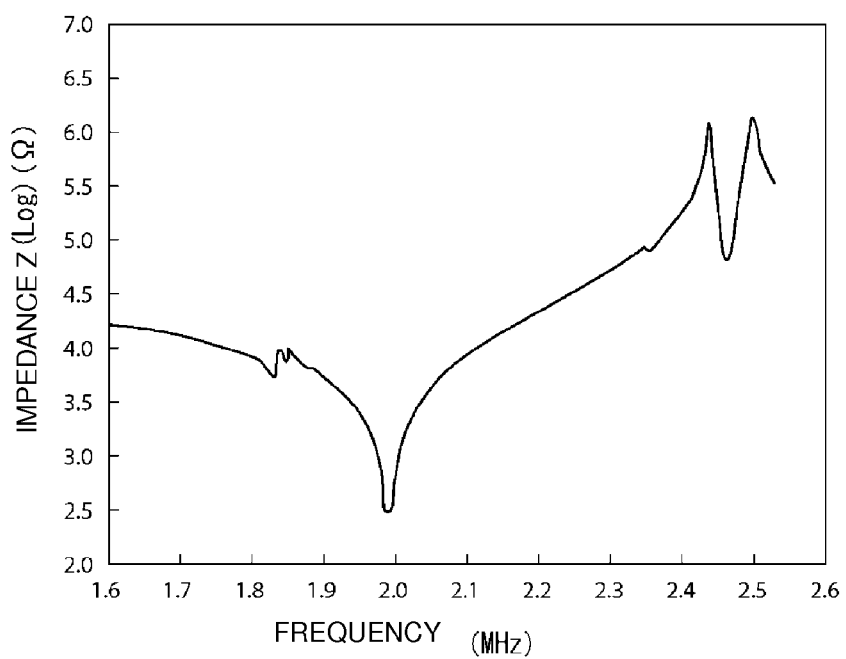
FIG. 7 is a diagram that illustrates the resonance characteristics of a piezoelectric bulk-wave resonator that has a single-crystal $LiNbO_3$ substrate whose Euler Angles are about (90°, 90°, 40°)
Figure 8:
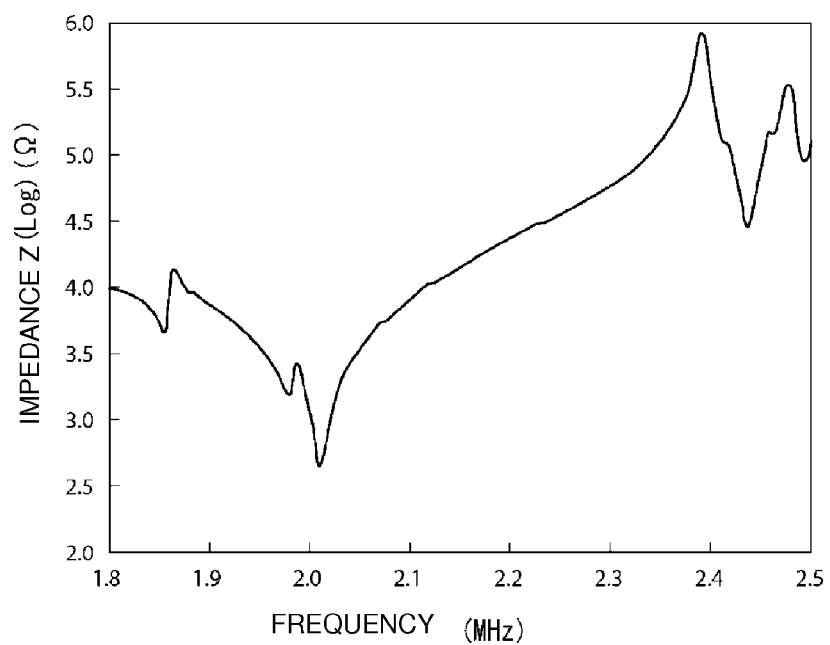
FIG. 8 is a diagram that illustrates the resonance characteristics of a piezoelectric bulk-wave resonator that has a single-crystal $LiNbO_3$ substrate whose Euler Angles are about (90°, 90°, 50°)
Figure 9:
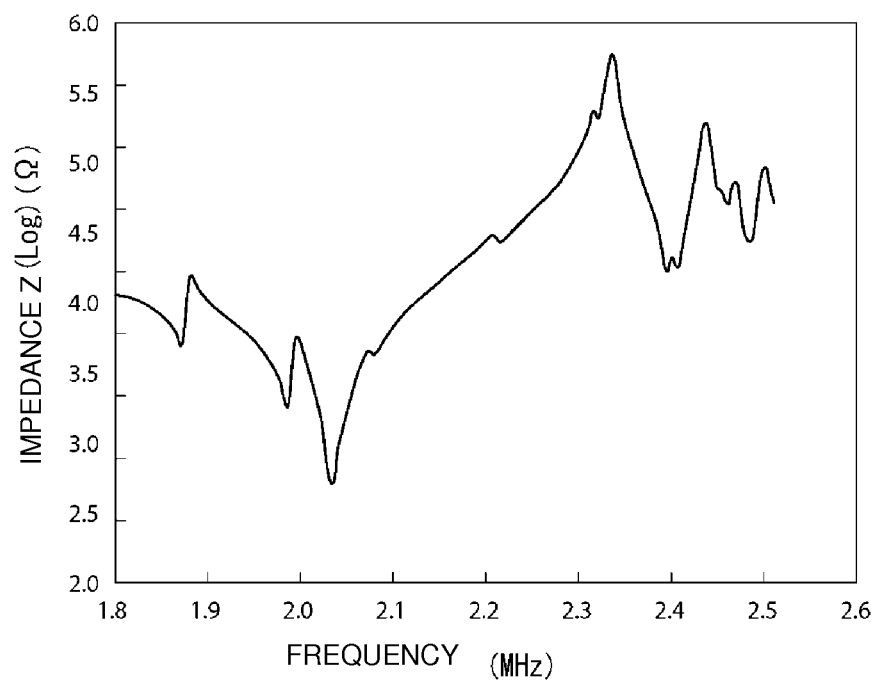
FIG. 9 is a diagram that illustrates the resonance characteristics of a piezoelectric bulk-wave resonator that has a single-crystal $LiNbO_3$ substrate whose Euler Angles are about (90°, 90°, 60°)

| | Euler Angles | Band width |
|---|---|---|
| FIG. 2 | (90°, 90°, 0°) | 10.0% |
| FIG. 3 | (90°, 90°, 10°) | 15.5% |
| FIG. 4 | (90°, 90°, 20°) | 18.2% |
| FIG. 5 | (90°, 90°, 30°) | 21.4% |
| FIG. 6 | (90°, 90°, 35°) | 22.6% |
| FIG. 7 | (90°, 90°, 40°) | 22.3% |
| FIG. 8 | (90°, 90°, 50°) | 19.0% |
| FIG. 9 | (90°, 90°, 60°) | 14.9% |

As is clear from Table 1, piezoelectric bulk-wave resonators that have a single-crystal LiNbO₃ substrate with an Euler Angle $\psi$ of about 20° to about 50°, both inclusive, can have the band width thereof increased to as broad as about 18% or more. In particular, the band width can be further increased to as broad as about 21.4% or more when the $\psi$ is about in the range of 30° to 40°.

FIG. 10 to FIG. 13 are diagrams that illustrate the resonance characteristics of piezoelectric bulk-wave resonators similar to the above ones except that single-crystal LiNbO₃ substrates with Euler Angles of about (60°, 90°, 0°), about (60°, 90°, 10°), about (60°, 90°, 50°), and about (60°, 90°, 60°), respectively, were used.

Table 2 summarizes the Euler Angles and the band width of piezoelectric bulk-wave resonators with which the resonance characteristics illustrated in FIG. 10 to FIG. 13 have been obtained.

TABLE 2

Figure 10:
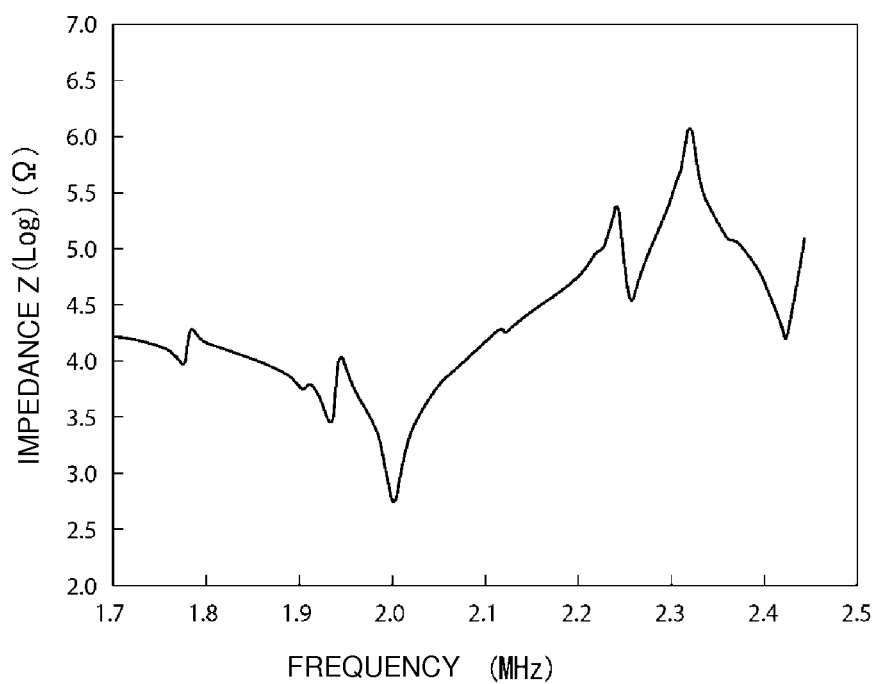
FIG. 10 is a diagram that illustrates the resonance characteristics of a piezoelectric bulk-wave resonator that has a single-crystal $LiNbO_3$ substrate whose Euler Angles are about (60°, 90°, 0°)
Figure 11:
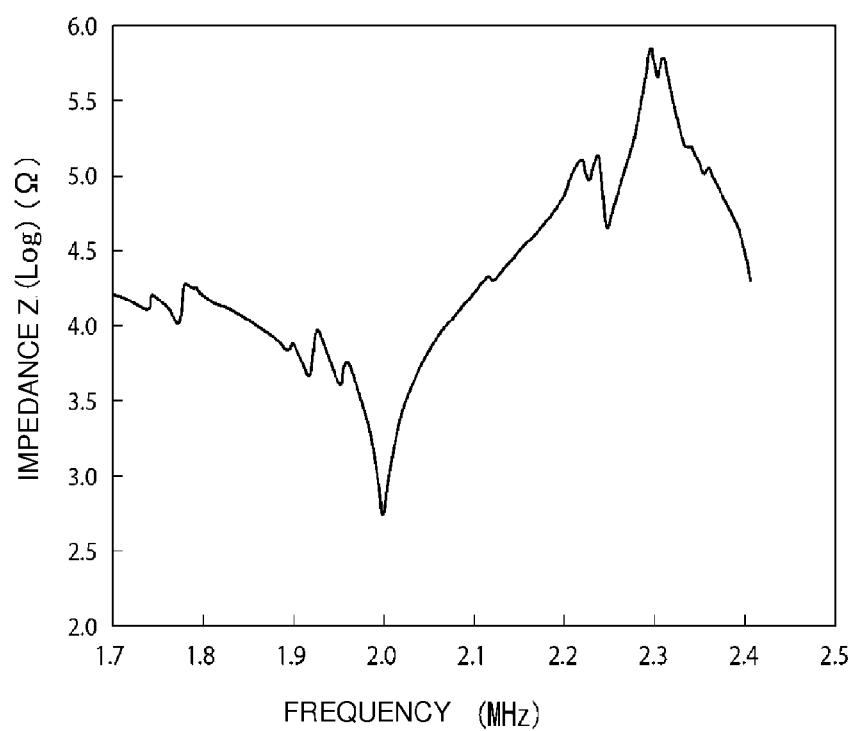
FIG. 11 is a diagram that illustrates the resonance characteristics of a piezoelectric bulk-wave resonator that has a single-crystal $LiNbO_3$ substrate whose Euler Angles are about (60°, 90°, 10°)
Figure 12:
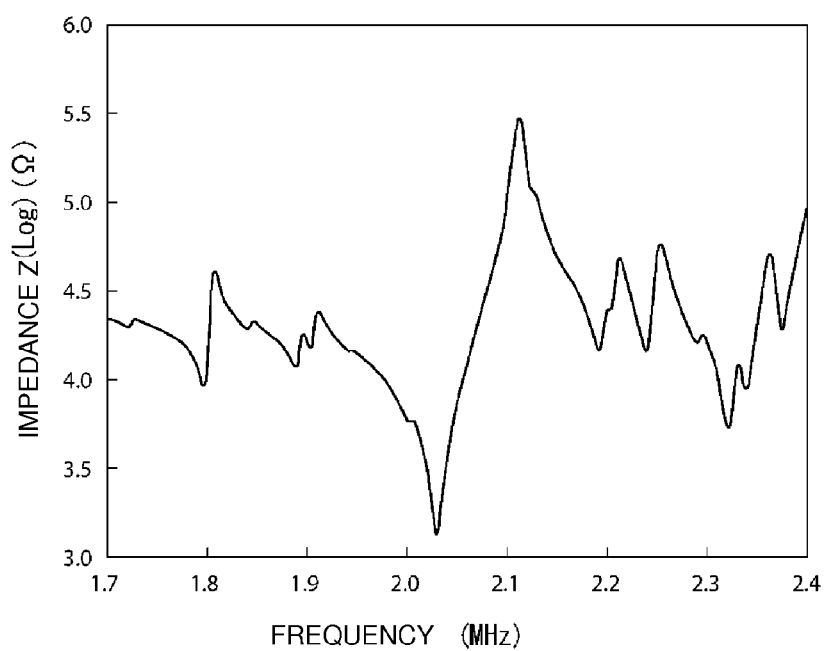
FIG. 12 is a diagram that illustrates the resonance characteristics of a piezoelectric bulk-wave resonator that has a single-crystal $LiNbO_3$ substrate whose Euler Angles are about (60°, 90°, 50°)
Figure 13:
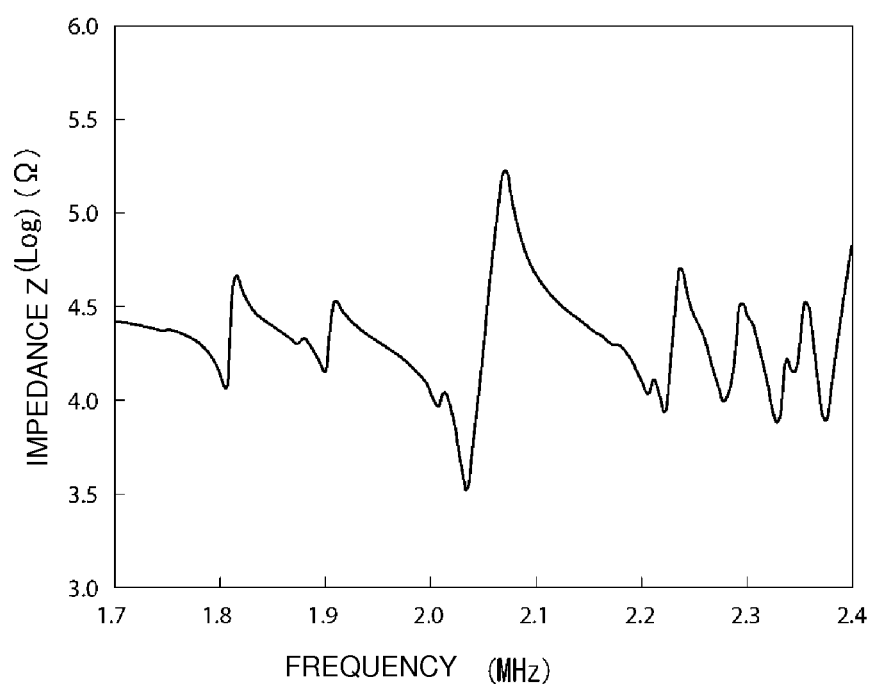
FIG. 13 is a diagram that illustrates the resonance characteristics of a piezoelectric bulk-wave resonator that has a single-crystal $LiNbO_3$ substrate whose Euler Angles are about (60°, 90°, 60°)

| | Euler Angles | Band width |
|---|---|---|
| FIG. 10 | (60°, 90°, 0°) | 15.5% |
| FIG. 11 | (60°, 90°, 10°) | 15.0% |
| FIG. 12 | (60°, 90°, 50°) | 5.9% |
| FIG. 13 | (60°, 90°, 60°) | 2.7% |

As is clear from Table 2, the band width was as narrow as about 15.5% or less when piezoelectric bulk-wave resonators with Euler Angles of about (60°, 90°, $\psi$) were used.

Figure 14:
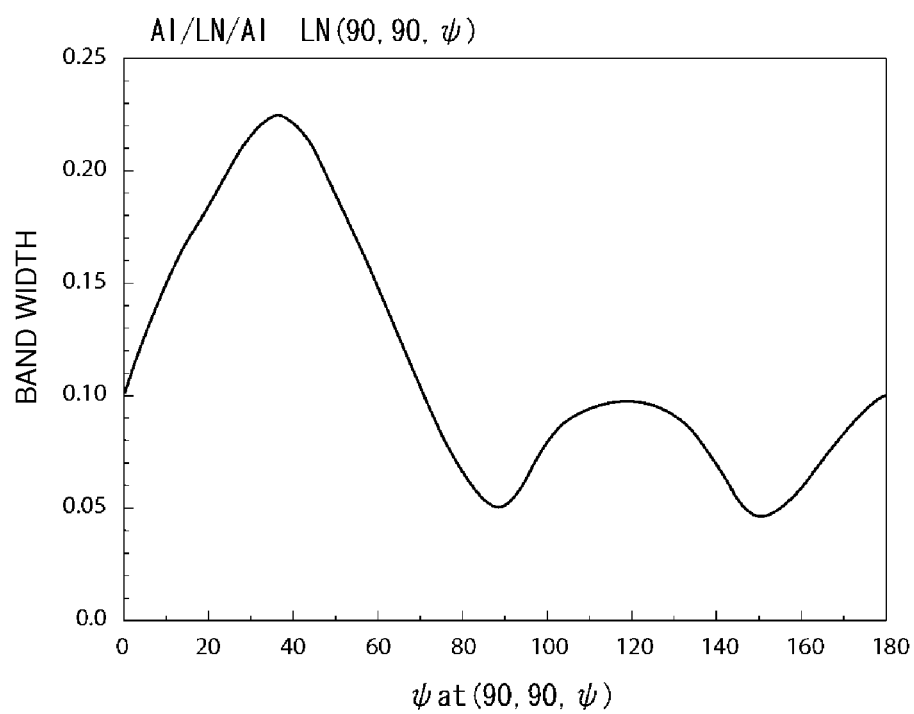
FIG. 14 is a diagram that illustrates the relationship between the Euler Angle ψ and the band width of a single-crystal $LiNbO_3$ substrate used in a piezoelectric bulk-wave resonator.

Hence the relationship between the $\psi$ of the Euler Angles of about (90°, 90°, $\psi$) and the band width of the piezoelectric bulk-wave resonator was determined with different $\psi$ values. The result is illustrated in FIG. 14. Likewise, the changes in band width were determined with the use of single-crystal LiNbO₃ substrates with Euler Angles of about (90°, $\theta$, 40°) with different $\theta$ values. The result is illustrated in FIG. 15.

Figure 16:
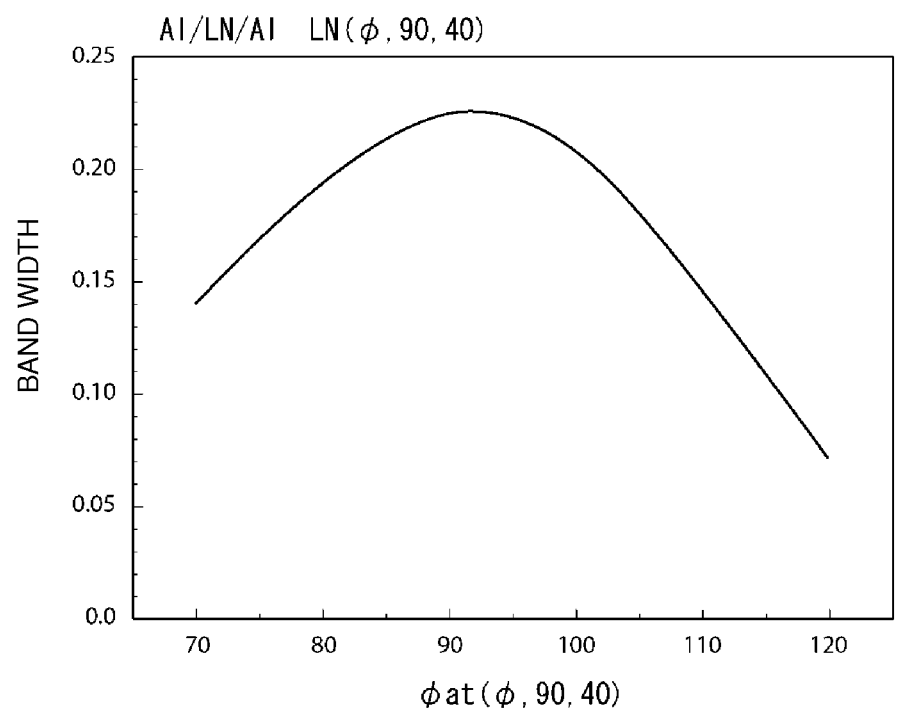
FIG. 16 is a diagram that illustrates the relationship between the Euler Angle φ and the band width of a single-crystal $LiNbO_3$ substrate used in a piezoelectric bulk-wave resonator.

Furthermore, FIG. 16 illustrates the changes in band width determined with the use of single-crystal LiNbO₃ substrates with Euler Angles of about ($\phi$, 90°, 40°) with different $\phi$ values.

Figure 15:
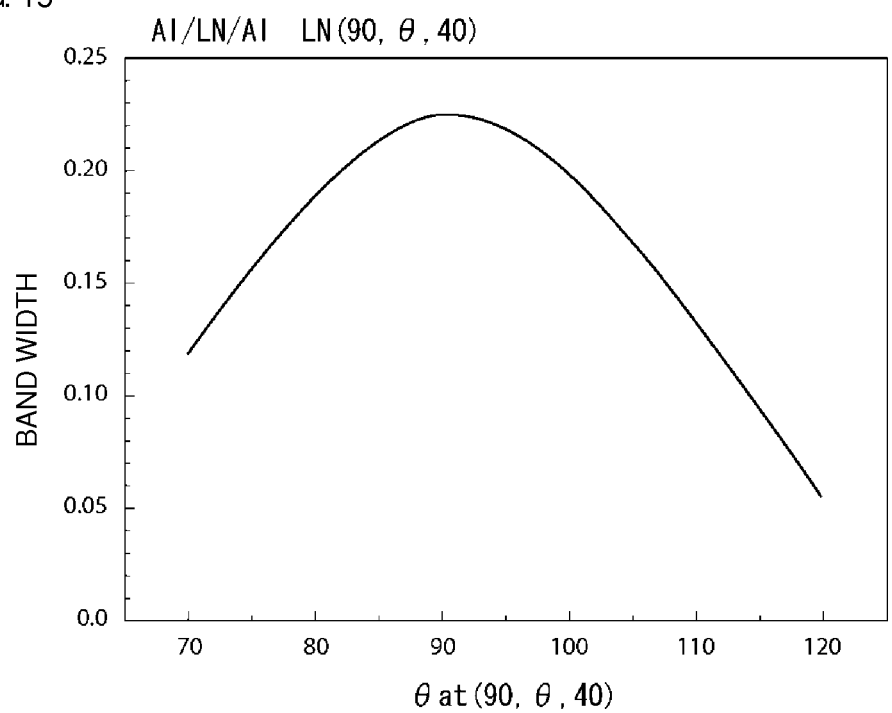
FIG. 15 is a diagram that illustrates the relationship between the Euler Angle θ and the band width of a single-crystal $LiNbO_3$ substrate used in a piezoelectric bulk-wave resonator.

As is clear from FIG. 14 to FIG. 16, the band width can be about 18% or more when the Euler Angles were about (78° to 106°, 78° to 104°, 18° to 53°). This indicates that an embodiment of the present invention provides a wide-band piezoelectric bulk-wave resonator 1. More preferably, the use of a single-crystal LiNbO₃ substrate with about (79° to 103°, 80° to 102°, 22° to 50°) can further increase the band width to as broad as about 19% or more.

A piezoelectric bulk-wave resonator according to an embodiment of the present invention is, as described above, a thickness-shear resonator that has a single-crystal LiNbO₃ substrate with Euler Angles in particular ranges. This means that the structure is not limited except for the Euler Angles of the single-crystal LiNbO₃ substrate. As discussed above, the piezoelectric bulk-wave resonator 1 can have an increased band width, i.e., an increased frequency difference between the resonance frequency and the anti-resonance frequency. A broad-band band-pass filter can therefore be easily prepared with the use of a number of such piezoelectric bulk-wave resonators 1.

While preferred embodiments of the invention have been described above, it is to be understood that variations and modifications will be apparent to those skilled in the art without departing from the scope and spirit of the invention. The scope of the invention, therefore, is to be determined solely by the following claims.

What is claimed is:

1. A piezoelectric bulk-wave resonator comprising:
a single-crystal $LiNbO_3$ substrate having a first main surface and a second main surface opposite the first main surface;
a first driver electrode adjacent a first area of the first main surface of the single-crystal $LiNbO_3$ substrate; and
a second driver electrode adjacent the second main surface, the second driver electrode facing the first driver electrode across the single-crystal $LiNbO_3$ substrate, wherein
the piezoelectric bulk-wave resonator is constructed to use a thickness-shear mode, and
the single-crystal $LiNbO_3$ substrate has a Euler Angle $\phi$ in a range of 78° to 106°, a Euler Angle $\theta$ in a range of 78° to 104°, and a Euler Angle $\psi$ in a range of 18° to 53°.

2. The piezoelectric bulk-wave resonator according to claim 1, wherein the single-crystal $LiNbO_3$ substrate has the Euler Angle $\phi$ in a range of 79° to 103°, the Euler Angle $\theta$ in a range of 80° to 102°, and the Euler Angle $\psi$ in a range of 22° to 50°.

3. The piezoelectric bulk-wave resonator according to claim 1, wherein the single-crystal $LiNbO_3$ substrate has a substantially rectangular planar shape.

4. The piezoelectric bulk-wave resonator according to claim 1, wherein the first driver electrode and the second driver electrode overlap each other across a portion of the single-crystal $LiNbO_3$ substrate.

5. The piezoelectric bulk-wave resonator according to claim 4, wherein the portion of the single-crystal $LiNbO_3$ substrate where the first driver electrode and the second driver electrode overlap each other is a vibration section.

* * * * *